United States Patent
Peterson et al.

(10) Patent No.: US 9,663,852 B2
(45) Date of Patent: May 30, 2017

(54) COATED ARTICLE WITH DARK COLOR

(71) Applicant: Vapor Technologies, Inc., Longmont, CO (US)

(72) Inventors: Nicholas L. Peterson, Erie, CO (US); Bryce R. Anton, Longmont, CO (US)

(73) Assignee: Vapor Technologies Inc., Longmont, CO (US)

( * ) Notice: Subject to any disclaimer, the term of this patent is extended or adjusted under 35 U.S.C. 154(b) by 351 days.

(21) Appl. No.: 14/303,003

(22) Filed: Jun. 12, 2014

(65) Prior Publication Data

US 2014/0295156 A1    Oct. 2, 2014

Related U.S. Application Data

(62) Division of application No. 13/790,342, filed on Mar. 8, 2013, now Pat. No. 8,974,896.

(51) Int. Cl.
| | |
|---|---|
| *C23C 28/00* | (2006.01) |
| *C23C 14/00* | (2006.01) |
| *C23C 28/04* | (2006.01) |
| *C09D 5/00* | (2006.01) |
| *C08K 3/00* | (2006.01) |
| *C09D 1/00* | (2006.01) |

(52) U.S. Cl.
CPC ............ *C23C 14/0015* (2013.01); *C08K 3/00* (2013.01); *C09D 1/00* (2013.01); *C09D 5/00* (2013.01); *C23C 28/042* (2013.01); *Y10T 428/2495* (2015.01); *Y10T 428/265* (2015.01)

(58) Field of Classification Search
CPC .. C23C 14/0015; C23C 16/006; C23C 28/042
See application file for complete search history.

(56) References Cited

U.S. PATENT DOCUMENTS

| 4,497,874 | A | * | 2/1985 | Hale | C23C 16/0209 427/249.19 |
|---|---|---|---|---|---|
| 4,643,952 | A | * | 2/1987 | Kurakata | C23C 14/0015 427/569 |
| 4,758,280 | A | * | 7/1988 | Bergmann | C23C 14/0015 106/286.4 |
| 5,079,089 | A | * | 1/1992 | Ito | C23C 14/0015 428/213 |
| 5,225,382 | A | * | 7/1993 | Mizuno | C23C 14/083 106/436 |

(Continued)

FOREIGN PATENT DOCUMENTS

JP    11223811 A  *  8/1999

OTHER PUBLICATIONS

Fernandes et al. "Optical properties of titanium oxycarbide thin film," Applied Surface Science, vol. 255, 2009, p. 5615-5619.*

(Continued)

*Primary Examiner* — Aaron Austin
*Assistant Examiner* — Zheren J Yang
(74) *Attorney, Agent, or Firm* — Emch, Schaffer, Schaub & Porcello Co., L.P.A.

(57) ABSTRACT

An article is coated with a coating having a dark color. In a preferred embodiment, the coating comprises a nickel or polymer basecoat layer, and a first color layer comprised of oxygen-rich refractory metal oxycarbides, a second color layer comprising oxygen-rich refractory metal oxycarbides and a top layer of refractory metal oxides.

7 Claims, 3 Drawing Sheets

(56) References Cited

U.S. PATENT DOCUMENTS

| | | | | |
|---|---|---|---|---|
| 5,592,317 | A * | 1/1997 | Fujikawa | G03F 7/0007 349/105 |
| 5,871,850 | A * | 2/1999 | Moriguchi | C23C 28/04 407/119 |
| 5,928,977 | A * | 7/1999 | Magnin | C04B 35/486 427/215 |
| 6,132,889 | A * | 10/2000 | Welty | C23C 28/00 428/623 |
| 6,391,457 | B1 * | 5/2002 | Welty | B05D 5/067 428/412 |
| 6,548,193 | B2 * | 4/2003 | Chen | C23C 28/322 428/469 |
| 7,264,668 | B2 * | 9/2007 | Lau | C23C 14/0015 106/286.1 |
| 7,270,895 | B2 | 9/2007 | Anton | |
| 7,297,397 | B2 * | 11/2007 | Leininger | B05D 5/068 427/402 |
| 7,597,970 | B2 * | 10/2009 | Fukano | C23C 16/36 428/336 |
| 7,635,528 | B1 * | 12/2009 | Chen | C23C 14/0015 204/192.15 |
| 7,887,935 | B2 * | 2/2011 | Elkouby | C23C 16/0272 427/419.1 |
| 8,007,928 | B2 | 8/2011 | Peterson et al. | |
| 8,080,323 | B2 * | 12/2011 | Ban | B23B 27/141 407/119 |
| 8,124,222 | B2 * | 2/2012 | Myrtveit | C23C 30/005 204/192.1 |
| 8,361,635 | B2 * | 1/2013 | Chang | C23C 14/025 428/215 |
| 2003/0072974 | A1 * | 4/2003 | Lau | C23C 14/0015 428/698 |
| 2003/0113558 | A1 * | 6/2003 | Chen | B05D 5/067 428/457 |
| 2004/0247904 | A1 * | 12/2004 | Chan | C23C 14/0015 428/469 |
| 2006/0222892 | A1 * | 10/2006 | Anton | C08J 7/045 428/698 |
| 2008/0264903 | A1 * | 10/2008 | Anton | B05D 5/06 216/48 |
| 2010/0086756 | A1 * | 4/2010 | Miya | A44C 27/006 428/213 |
| 2010/0119873 | A1 * | 5/2010 | Peterson | C23C 14/0015 428/698 |
| 2010/0227156 | A1 * | 9/2010 | Satoh | C22C 5/02 428/332 |
| 2010/0255340 | A1 * | 10/2010 | Ge | A47J 36/02 428/655 |
| 2011/0164297 | A1 * | 7/2011 | Abe | C23C 14/0015 359/227 |
| 2011/0192320 | A1 * | 8/2011 | Likibi | C23C 14/0623 106/286.2 |
| 2012/0052321 | A1 * | 3/2012 | Thomas | C23C 14/0015 428/623 |
| 2012/0164478 | A1 * | 6/2012 | Ugues | C23C 14/0015 428/632 |
| 2013/0171448 | A1 * | 7/2013 | Takazaki | C23C 14/0015 428/336 |
| 2014/0017446 | A1 * | 1/2014 | Ding | C25F 3/02 428/138 |
| 2014/0044990 | A1 * | 2/2014 | Tsukamoto | A44C 27/006 428/661 |
| 2014/0377483 | A1 * | 12/2014 | Zhang | C23C 14/0015 428/34.1 |
| 2015/0064469 | A1 * | 3/2015 | Takazaki | C23C 14/0015 428/408 |
| 2015/0072138 | A1 * | 3/2015 | Takazaki | C23C 14/0015 428/336 |

OTHER PUBLICATIONS

Fernandes et al. "TiCxOy thin films for decorative applications: Tribocorrosion mechaniosms and synergism," Tribology International, vol. 41, 2008, p. 603-615.*

Fernandes et al. "Property change in multifunctional TiCxOy thin films: Effect of the O/Ti ratio," Thin Solid Films, vol. 515, 2006, p. 866-871.*

Machine translation of JP H11/223811 A, obtained from Industrial Digital Property Library of the JPO on Jul. 8, 2016.*

* cited by examiner

COATED ARTICLE WITH DARK COLOR

CROSS REFERENCE TO RELATED APPLICATION

The present patent application is a divisional of and claims the benefit of U.S. patent application Ser. No. 13/790,342 filed Mar. 8, 2013.

FIELD OF THE INVENTION

This invention relates to articles, particularly articles such as faucets, having a decorative and protective coating having the appearance of a dark color. More specifically, the dark color is black, dark bronze, blue-black, vivid blue or a blue-grey color.

BACKGROUND OF THE INVENTION

Current industry practice with various brass articles such as faucets, faucet escutcheons, door knobs, door handles, door escutcheons and the like, is to first buff and polish the surface of the article to a high gloss and to then apply a protective organic coating, such as one comprised of acrylics, urethanes, epoxies and the like, onto this polished surface. This system has the drawback that the buffing and polishing operation, particularly if the article is of a complex shape, is labor intensive. Also, the known organic coatings are not always as durable as desired, and are susceptible to attack by acids. It would, therefore, be quite advantageous if brass articles, or indeed other articles, either plastic, ceramic, or metallic, could be provided with coating which provided the article with a decorative appearance as well as providing wear resistance, abrasion resistance and corrosion resistance.

U.S. Pat. No. 7,270,895 represents a recent development in this technology. The patent discloses an article coated with a layer coating having a dark color. Preferably, the color is dark gray or a dark bronze color. The coating comprises a color and protective layer comprised of a refractory metal oxycarbide wherein the oxygen content is greater than the carbon content. The refractory metal typically is zirconium.

U.S. Pat. No. 8,007,928 represents another recent development in this technology. The patent discloses an article coated with a layer coating having a black color. The coating comprises a second color layer comprised of a refractory metal oxycarbide wherein the oxygen content is greater than the carbon content and a third layer comprised of a refractory metal oxide. The search for novel appearances not previously achievable continues.

SUMMARY OF THE INVENTION

The present invention is directed to an article having a dark color. A preferred coated article has a black color and comprises a substrate having a surface and having on at least a portion of the surface a multi-layer coating comprising in order:

a first layer of a refractory metal oxycarbide having an oxygen content and a carbon content wherein the oxygen content is greater than the carbon content wherein the refractory metal oxycarbide of the first color layer is 20 to 35 atomic percent oxygen, 10 to 20 atomic percent carbon and 50 to 70 atomic percent refractory metal, a second color layer on top of the first color layer;

wherein the second color layer comprises a layer of refractory metal oxycarbide having an oxygen content and a carbon content wherein the oxygen content is greater than the carbon content; and wherein the oxygen content of the second color layer is greater than the oxygen content of the first color layer wherein the refractory metal oxycarbide of the second color layer is 40 to 65 atomic percent oxygen, 5 to 20 atomic percent carbon and 25 to 50 atomic percent refractory metal; and a refractory metal oxide layer on top of the second color layer.

In another preferred embodiment, the coated article has a dark color (black, dark bronze, blue-black) comprising:

a substrate having a surface and having on at least a portion of the surface a multi-layer coating comprising in order; a first layer of a refractory metal oxycarbide having an oxygen content and a carbon content wherein the oxygen content is greater than the carbon content wherein the refractory metal oxycarbide of the first color layer is 20 to 35 atomic percent oxygen, 10 to 20 atomic percent carbon and 50 to 70 atomic percent refractory metal, a second color layer on top of the first color layer, wherein the second color layer comprises a layer of refractory metal oxycarbide having an oxygen content and a carbon content wherein the oxygen content is greater than the carbon content; and wherein the oxygen content of the second color layer is greater than the oxygen content of the first color layer wherein the refractory metal oxycarbide of the second color layer is 40 to 65 atomic percent oxygen, 5 to 20 atomic percent carbon and 25 to 50 atomic percent refractory metal; and a refractory metal oxide layer on top of the second color layer.

This embodiment encompasses dark bluish and bronze shades as well as black. The general coating compositions are the same, but layer thicknesses are modified to achieve different color shades.

DETAILED DESCRIPTION OF THE INVENTION

The present invention is directed to an article such as a plastic, ceramic, cermet or metallic article having the decorative and protective coating deposited on at least a portion of its surface. More particularly, it is directed to an article or substrate, particularly a metallic article such as stainless steel, aluminum, brass or zinc, having deposited on its surface the layers described herein. The coating is decorative and also provides corrosion resistance, wear resistance and abrasion resistance. The coating provides the appearance of a black color.

A preferred coated article has a black color and comprises a substrate having a surface and having on at least a portion of the surface a multi-layer coating comprising in order:

a first layer of a refractory metal oxycarbide having an oxygen content and a carbon content wherein the oxygen is greater than the carbon content wherein the refractory metal oxycarbide of the first color layer is 20 to 35 atomic percent oxygen, 10 to 20 atomic percent carbon and 50 to 70 atomic percent refractory metal, a second color layer on top of the first color layer; wherein the second color layer comprises a layer of refractory metal oxycarbide having an oxygen content and a carbon content wherein the oxygen content is greater than the carbon content; and wherein the oxygen content of the second color layer is greater than the oxygen content of the first color layer wherein the refractory metal oxycarbide of the second color layer is 40 to 65 atomic percent oxygen, 5 to 20 atomic percent carbon and 25 to 50 atomic percent refractory metal; and a refractory metal oxide layer on top of the second color layer.

Generally, the refractory metal oxide top layer is hafnium, tantalum, zirconium or titanium oxide. Preferably the refractory metal oxide top layer is zirconium oxide.

Figure 1:
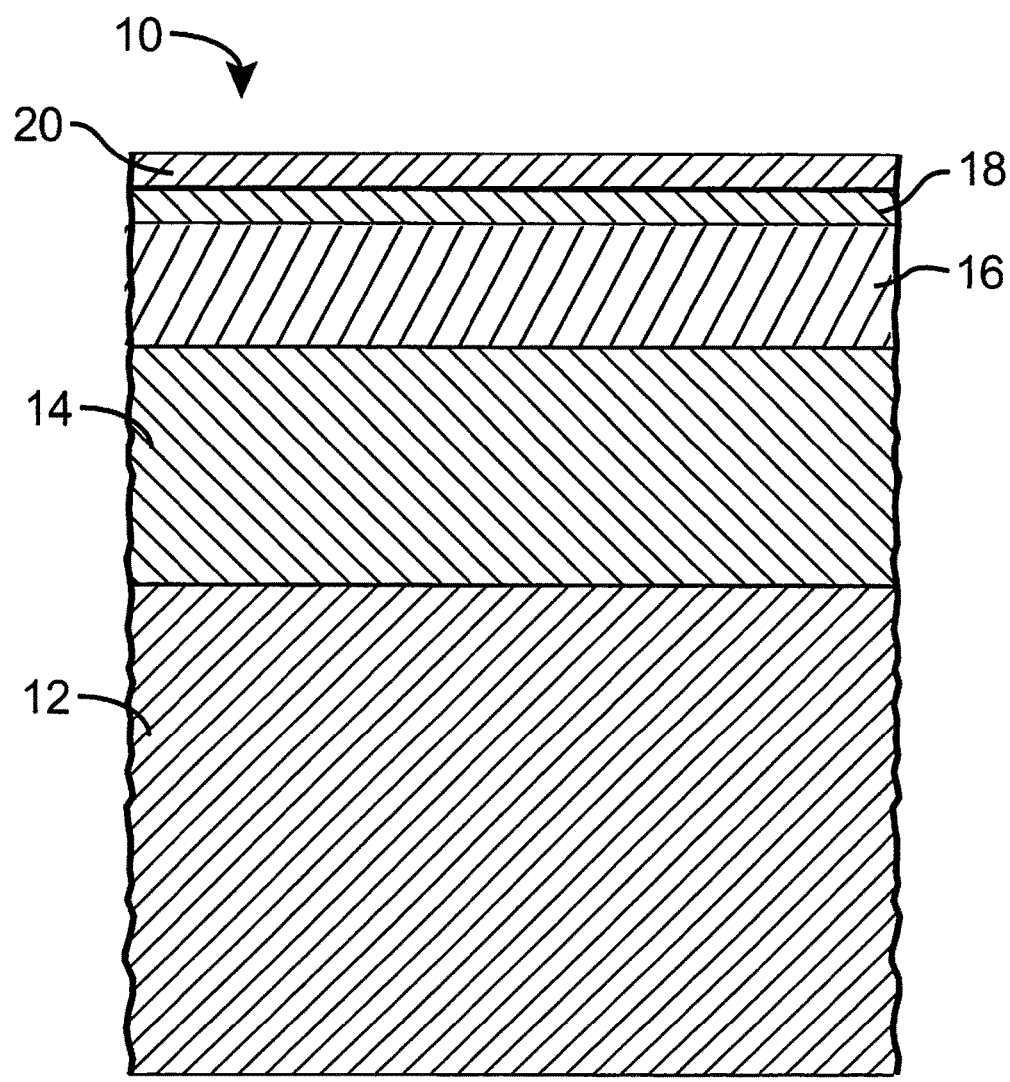
FIG. 1 is a cross sectional view, not to scale, of a portion of the substrate having the black color of this invention thereon.

FIG. 1 shows Article 10 comprising substrate 12. Substrate 12 can be comprised of any material onto which a plated layer can be applied, such as plastic, e.g., ABS, polyolefin, polyvinylchloride, and phenolformaldehyde, ceramic, cermet, metal or metal alloy. In one embodiment it is comprised of a metal or metallic alloy such as copper, steel, brass, zinc, aluminum, nickel alloys and the like.

In the instant invention, as illustrated in FIG. 1, a first layer or series of layers is applied onto the surface of the article by plating such as electroplating in the case of a nickel basecoat. In the case of a polymeric basecoat, the polymer is applied by conventional means. A second series of layers is applied onto the surface of the basecoat layer or layers by vapor deposition. The polymer or electroplated layers serve, inter alia, as a base coat which levels the surface of the article and as a corrosion barrier to improve corrosion resistance. In one embodiment of the instant invention a nickel layer 14 may be deposited on the surface of the article. The nickel layer may be any of the conventional nickels that are deposited by plating, e.g., bright nickel, semi-bright nickel, satin nickel, etc. Nickel layer 14 may be deposited on at least a portion of the surface of the substrate 12 by conventional and well-known electroplating processes. Layer 14 may be one or more layers of copper, nickel and chromium. These corrosion protective layers are well known in the art.

Layer 14 may be comprised of a polymer applied onto the surface of article 10 as a basecoat layer. A second series of layers is applied onto the surface of the polymeric layer by vapor deposition. The polymeric layer serves, inter alia, as a base coat which levels the surface of the article and as a corrosion barrier to improve corrosion resistance. In the instant invention polymeric layer 14 is deposited on the surface of the article.

Polymeric basecoat layer 14 may be comprised of both thermoplastic and thermoset polymeric or resinous material. These polymeric or resinous materials include the well known, conventional and commercially available polycarbonates, epoxy urethanes, polyacrylates, polymethacrylates, nylons, polyesters, polypropylenes, polyepoxies, alkyds and styrene containing polymers such as polystyrene, styrene-acrylonitrile (SAN), styrene-butadiene, acrylonitrile-butadiene-styrene (ABS), and blends and copolymers thereof. The polymers for layer 14 are well known in the art.

Over layer 14 is deposited, by vapor deposition such as physical vapor deposition or chemical vapor deposition, protective and decorative color layer 16. Color layer 16 is comprised of a layer refractory metal oxycarbide having an oxygen content and a carbon content wherein the oxygen content is greater than carbon content.

Second color layer 18 is deposited on top of first color layer 16. Second color layer 18 comprises a layer of refractory metal oxycarbide having an oxygen content and a carbon content wherein the oxygen content is greater than the carbon content; and wherein the oxygen content and the carbon content of second color layer 18 is greater than the oxygen content and the carbon content of first color layer 16.

The thickness of color and protective layers 16 and 18 are of a thickness which is at least effective to provide the color of dark gray and to provide abrasion resistance, scratch resistance, and wear resistance. Generally, this thickness is at least about 1,000 Å, preferably at least about 1,500 Å, and more preferably at least about 2,500 Å. The upper thickness range is generally not critical and is dependent upon secondary considerations such as cost. Generally a thickness of about 7500 Å, preferably about 5000 Å should not be exceeded.

Layers 16 and 18 are deposited by conventional and well known techniques including vapor deposition techniques such as cathodic arc evaporation (CAE) or sputtering, and the like. Sputtering and CAE techniques and equipment are disclosed, inter alia, in J. Vossen and W. Kern "Thin Film Processes II", Academic Press, 1991; R. Boxman et al, "Handbook of Vacuum Arc Science and Technology", Noyes Pub., 1995; and U.S. Pat. Nos. 4,162,954 and 4,591,418, all of which are incorporated herein by reference.

One method of depositing layers 16 and 18 are by physical vapor deposition utilizing reactive sputtering or reactive cathodic arc evaporation. Reactive cathodic arc evaporation and reactive sputtering are generally similar to ordinary sputtering and cathodic arc evaporation except that a reactive gas is introduced into the chamber which reacts with the dislodged target material.

Next, refractory metal oxide layer 20 is deposited on top of second color layer 18. The refractory metal oxides include oxides of hafnium, tantalum, zirconium, titanium and titanium-zirconium alloys. Generally, this thickness of layer 20 is at least about 60 Å, preferably at least about 120 Å, and more preferably about 250 Å.

Layer 20 is deposited by conventional and well known vapor deposition techniques including physical vapor deposition techniques such as cathodic arc evaporation (CAE) or sputtering. Briefly, in the sputtering deposition process a refractory metal (such as titanium or zirconium) target, which is the cathode, and the substrate are placed in a vacuum chamber. The air in the chamber is evacuated to produce vacuum conditions in the chamber. An inert gas, such as Argon, is introduced into the chamber. The gas particles are ionized and are accelerated to the target to dislodge titanium or zirconium atoms. The dislodged target material is then typically deposited as a coating film on the substrate.

In cathodic arc evaporation, an electric arc of typically several hundred amperes is struck on the surface of a metal cathode such as zirconium or titanium. The arc vaporizes the cathode material, which then condenses on the substrates forming a coating.

In another preferred embodiment, the article of FIG. 1 has a black, dark bronze or blue-black color. This embodiment is a substrate having a surface and having on at least a portion of the surface a multi-layer coating comprising in order; a first layer of a refractory metal oxycarbide having an oxygen content and a carbon content wherein the oxygen content is greater than the carbon content wherein the refractory metal oxycarbide of the first color layer is 20 to 35 atomic percent oxygen, 10 to 20 atomic percent carbon and 50 to 70 atomic percent refractory metal, a second color layer on top of the first color layer, wherein the second color layer comprises a layer of refractory metal oxycarbide having an oxygen content and a carbon content wherein the oxygen content is greater than the carbon content; and wherein the oxygen content of the second color layer is greater than the oxygen content of the first color layer wherein the refractory metal oxycarbide of the second color layer is 40 to 65 atomic percent oxygen, 5 to 20 atomic percent carbon and 25 to 50 atomic percent refractory metal; and a refractory metal oxide layer on top of the second color layer.

This embodiment encompasses bluish and bronze shades as well as black. The general coating compositions are the same, but layer thicknesses are modified to achieve different color shades.

Figure 2:
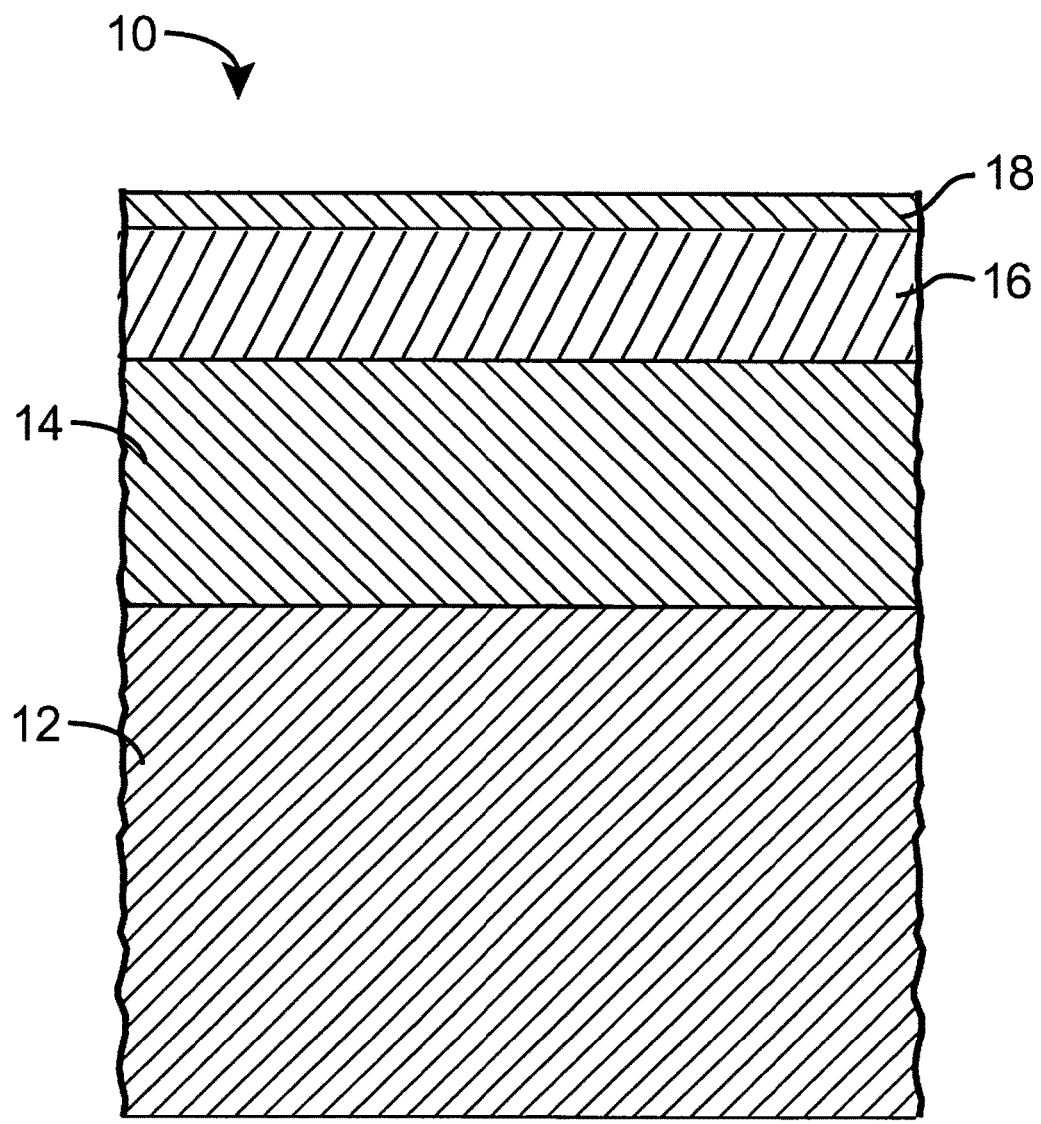
FIG. 2 is a view of FIG. 1 without top layer 20.

FIG. 2 shows an article having a blue-grey color that does not use all three color layers, but just the first and second color layer with no top layer 20.

The coated article has a blue-grey color comprising a substrate having a surface and having on at least a portion of the surface a multi-layer coating comprising in order: a first layer of a refractory metal oxycarbide having an oxygen content and a carbon content wherein the oxygen content is greater than the carbon content wherein the refractory metal oxycarbide of the first color layer is 20 to 35 atomic percent oxygen, 10 to 20 atomic percent carbon and 50 to 70 atomic percent refractory metal, a second color layer on top of the first color layer, wherein the second color layer comprises a layer of refractory metal oxycarbide having an oxygen content and a carbon content wherein the oxygen content is greater than the carbon content; and wherein the oxygen content of the second color layer is greater than the oxygen content of the first color layer wherein the refractory metal oxycarbide of the second color layer is 40 to 65 atomic percent oxygen, 5 to 20 atomic percent carbon and 25 to 50 atomic percent refractory metal.

Preferably the refractory metal oxycarbide of the first color layer is 15 atomic percent carbon and 25 to 30 atomic percent oxygen.

Preferably the refractory metal oxycarbide of the second color layer is 10 atomic percent carbon and 50 to 60 atomic percent oxygen.

Figure 3:
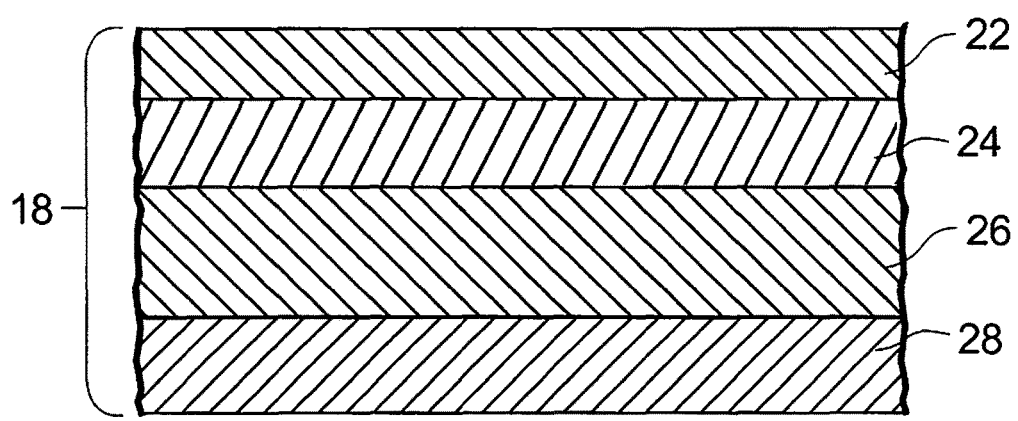
FIG. 3 shows second color layer 18 comprising a multiplicity of alternating layers.

FIG. 3 shows how to achieve a vivid blue color by alternating or pulsing between the top two layers many times at short durations. FIG. 3 shows second color layer 18 having layers 22, 24, 26, and 28. The number of layers in second color layer 18 may vary widely. The number of layers may range from 2 to 60. Preferably the number ranges from 2 to 30 and more preferably from 2 to 10. The thickness of each layer of second color layer 18 may vary.

In one embodiment, refractory metal oxide top layer 20 comprises alternating layers in much the same fashion as second color layer 18.

The coated article has a vivid blue color comprising a substrate having a surface and having on at least a portion of the surface a multi-layer coating comprising in order: a first layer of a refractory metal oxycarbide having an oxygen content and a carbon content wherein the oxygen content is greater than the carbon content wherein the refractory metal oxycarbide of the first color layer is 20 to 35 atomic percent oxygen, 10 to 20 atomic percent carbon and 50 to 70 atomic percent refractory metal, a second color layer on top of the first color layer, wherein the second color layer comprises alternating layers between a layer of refractory metal oxycarbide having an oxygen content and a carbon content wherein the oxygen content is greater than the carbon content; and wherein the oxygen content of the second layer is greater than the oxygen content of the first color layer wherein the refractory oxycarbide of the second color layer is 40 to 65 atomic percent oxygen, 5 to 20 atomic percent carbon and 25 to 50 atomic percent refractory metal; and a refractory metal oxide layer. The number of alternating layers in this second color layer may range between 4 and 60. Preferably, the range is 4 to 20 layers.

The refractory metal of the first color layer is hafnium, tantalum, zirconium, titanium or zirconium-titanium alloy.

The refractory metal oxycarbide of the first color layer is 15 atomic percent carbon and 25 to 30 atomic percent oxygen.

The refractory metal oxycarbide of the second color layer is 10 atomic percent carbon and 50 to 60 atomic percent oxygen.

The refractory metal oxide top layer is hafnium, tantalum, zirconium or titanium oxide.

Preferably, the refractory metal oxide top layer is zirconium oxide.

The first layer of this article has a dark gray color.

The first layer is a thicker than alternating layers comprising the second layer.

In order that the invention may be more readily understood, the following example is provided. The example is illustrative and does not limit the invention thereto.

Example I

Brass faucets are placed in a conventional soak cleaner bath containing the standard and well known soaps, detergents, deflocculants and the like which is maintained at a pH of 8.9-9.2 and a temperature of 180-200° F. for about 10 minutes. The brass faucets are then placed in a conventional ultrasonic alkaline cleaner bath. The ultrasonic cleaner bath has a pH of 8.9-9.2, is maintained at a temperature of about 160-180° F., and contains the conventional and well known soaps, detergents, deflocculants and the like. After the ultrasonic cleaning the faucets are rinsed and placed in a conventional alkaline electro cleaner bath.

The electro cleaner bath is maintained at a temperature of about 140-180° F., a pH of about 10.5-11.5, and contains standard and conventional detergents. The faucets are then rinsed twice and placed in a conventional acid activator bath. The acid activator bath has a pH of about 2.0-3.0, is at an ambient temperature, and contains a sodium fluoride based acid salt. The faucets are then rinsed twice and placed in a bright nickel plating bath for about 12 minutes. The bright nickel bath is generally a conventional bath which is maintained at a temperature of about 130-150° F., a pH of about 4.0, contains $NiSO_4$, $NiCl_2$, boric acid, and brighteners. A bright nickel layer of an average thickness of about 10 μm is deposited on the faucet surface.

The bright nickel plated faucets are rinsed three times and then placed in a conventional, commercially available hexavalent chromium plating bath using conventional chromium plating equipment for about seven minutes. The hexavalent chromium bath is a conventional and well known bath which contains about 32 ounces/gallon of chromic acid. The bath also contains the conventional and well known chromium plating additives. The bath is maintained at a temperature of about 112°-116° F., and utilizes a mixed sulfate/fluoride catalyst. The chromic acid to sulfate ratio is about 200:1. A chromium layer of about 0.25 μm is deposited on the surface of the bright nickel layer. The faucets are thoroughly rinsed in deionized water and then dried.

The chromium plated faucets are placed in a cathodic arc evaporation plating vessel. The vessel is generally a cylindrical enclosure containing a vacuum chamber which is adapted to be evacuated by means of pumps. A source of argon gas is connected to the chamber by an adjustable valve for varying the rate of flow of argon into the chamber. In addition, sources of methane and oxygen gases are connected to the chamber by adjustable valves for varying the flow rates of methane and oxygen into the chamber.

A cylindrical cathode is mounted in the center of the chamber and connected to negative outputs of a variable D.C. power supply. The positive side of the power supply is connected to the chamber wall. The cathode material comprises zirconium.

The plated faucets are mounted on spindles, of which are mounted on a ring around the outside of the cathode. The entire ring rotates around the cathode while each spindle also rotates around its own axis, resulting in a so-called planetary motion which provides uniform exposure to the cathode for the multiple faucets mounted around each spindle. The ring typically rotates at several rpm, while each spindle makes several revolutions per ring revolution. The spindles are electrically isolated from the chamber and provided with rotatable contacts so that a bias voltage may be applied to the substrates during coating.

The vacuum chamber is evacuated to a pressure of about $10^{-5}$ to $10^{-7}$ torr and heated to about 150° C.

The electroplated faucets are then subjected to a high-bias arc plasma cleaning in which a (negative) bias voltage of about −600 volts is applied to the electroplated faucets while an arc of approximately 500 amperes is struck and sustained on the cathode. The duration of the cleaning is approximately five minutes.

Zirconium oxycarbide color layer 16 now is deposited. Flows of argon and methane are introduced into the vacuum chamber while the arc discharge continues at approximately 500 amperes. In order to increase the darkness of the coating, a flow of oxygen, amounted to 30 to 40 percent of the total gas flow, may also be introduced into the chamber to produce the dark gray color. The flow rate of methane is adjusted such that the resulting layer contains a carbon content between 10 to 20 atomic percent.

Next zirconium oxycarbide color layer 18 is deposited on layer 16. flows of argon and methane are introduced into the vacuum chamber while the arc discharge continues at approximately 500 amperes. In order to increase the darkness of the coating, a flow of oxygen, amounted to 30 to 40 percent of the total gas flow, may also be introduced into the chamber to produce the dark gray color. The flow rate of methane is adjusted such that thus the resulting layer contains a carbon content between 10 to 20 atomic percent. After this zirconium oxycarbide layer is deposited, the flow of oxygen of approximately 100 to 500 standard liters per minute is introduced for a time of about 10 to 60 seconds. A thin layer of zirconium oxide with a thickness of about 20 to 100 Å is formed. The arc is extinguished, the vacuum chamber is vented and the coated articles removed.

After this zirconium oxycarbide layer is deposited, the flow of oxygen of approximately 100 to 500 standard liters per minute is introduced for a time of about 1 to 5 minutes. A thin layer of zirconium oxide with a thickness of about 100 to 1000 Å is formed. A layer of zirconium oxide (top layer 20) having an average thickness of about 0.1 µm is deposited during a one to five minute period. The arc is extinguished, the vacuum chamber is vented and the coated articles removed. The cathodic arc deposition process comprises applying D.C. power to the cathode to achieve a current flow of about 500 amps, introducing argon gas into the vessel to maintain the pressure in the vessel at about 1 to 5 millitorr and rotating the faucets in a planetary fashion described above.

Example II

In Example I, the end colors for layers 16 and 18 were in the color ranges for gray and bronze. These were measured on a color spectrophotometer using a D65 illuminant.

As is known, the measurement of color is determined by three specific parameters in which "L" is a measure of the lightness of an object, "a" is a measure of the redness (positive) or greenness (negative), and "b" is a measure of yellowness (positive) or blueness (negative). These three parameters, together, define a specific color.

The measured black color of Article 10 fell within the following ranges.

Article 10
Black:
$L^*=35.0+/-5.0$
$a^*=0.00+/-2.0$
$b^*=0.00+/-3.0$

The base layer has a gray color, zirconium oxycarbide is preferred. The next layer is also a zirconium oxycarbide, but is deposited with higher oxygen and carbon content. This layer darkens the appearance and has the effect of optically canceling out the yellow normally seen in the top layer, which is zirconium oxide. The combined properties of these three layers result in a much darker, blacker appearance than achievable previously.

Example III

The measured grey-blue color of the embodiment show in FIG. 2 fell within the following ranges:
$L^*=45.0\pm5.0$
$a^*=-2.0\pm2.0$
$b^*=-5.0\pm4.0$ The thickness of the second color topmost ZrOC layer 18, ranges between 30-60 nm. The base layer, the first color layer, can be 0.1 to 3 microns (or thicker), preferably 0.5 microns. This embodiment does not have top layer 20.

Example IV

The measured, vivid blue color of the embodiment shown in FIG. 3 fell within the ranges:
$L^*=40.0\pm5.0$
$a^*=-3.0\pm3.0$
$b^*=-25.0\pm5.0$ For the thicknesses of the individual alternating layers of second color layer 18 range between 2-10 nm thick layers. The first color layer 16 ranges from 0.1 to 3 microns (or thicker), preferably 0.5 microns.

While certain embodiments of the invention have been described for purposes of illustration, it is to be understood that there may be various embodiments and modifications within the general scope of the invention.

We claim:

1. A coated article having a blue-grey color comprising a substrate having a surface and having on at least a portion of the surface a multi-layer coating comprising in order:
   a first layer of a refractory metal oxycarbide having an oxygen content and a carbon content wherein the oxygen content is greater than the carbon content wherein the refractory metal oxycarbide of the first color layer is 20 to 35 atomic percent oxygen, 10 to 20 atomic percent carbon and 50 to 70 atomic percent refractory metal, a second color layer on top of the first color layer, wherein the second color layer comprises a layer of refractory metal oxycarbide having an oxygen content and a carbon content wherein the oxygen content is greater than the carbon content;

wherein the oxygen content of the second color layer is greater than the oxygen content of the first color layer wherein the refractory metal oxycarbide of the second color layer is 40 to 65 atomic percent oxygen, 5 to 20 atomic percent carbon and 25 to 50 atomic percent refractory metal; and wherein the second color layer is a top layer.

2. The article of claim 1 wherein the refractory metal oxycarbide of the first color layer is 15 atomic percent carbon and 25 to 30 atomic percent oxygen.

3. The article of claim 1 wherein the refractory metal oxycarbide of the second color layer is 10 atomic percent carbon and 50 to 60 atomic percent oxygen.

4. A coated article having a vivid blue color comprising a substrate having a surface and having on at least a portion of the surface a multi-layer coating comprising in order:

a first layer of a refractory metal oxycarbide having an oxygen content and a carbon content wherein the oxygen content is greater than the carbon content wherein the refractory metal oxycarbide of the first color layer is 20 to 35 atomic percent oxygen, 10 to 20 atomic percent carbon and 50 to 70 atomic percent refractory metal, a second color layer on top of the first color layer, wherein the second color layer comprises a layer of refractory metal oxycarbide having an oxygen content and a carbon content wherein the oxygen content is greater than the carbon content wherein the second color layer comprises a multiplicity of layers; and wherein the oxygen content of the second color is greater than the oxygen content of the first color layer wherein the refractory metal oxycarbide of the second color layer is 40 to 65 atomic percent oxygen, 5 to 20 atomic percent carbon and 25 to 50 atomic percent refractory metal; and a refractory metal oxide top layer; and
wherein the vivid blue color falls within the ranges:
$L^*=40.0\pm5.0$
$a^*=-3.0\pm3.0$
$b^*=-25.0\pm5.0$.

5. The article of claim 4 wherein the refractory metal oxycarbide of the first color layer is 15 atomic percent carbon and 25 to 30 atomic percent oxygen.

6. The article of claim 4 wherein the refractory metal oxycarbide of the second color layer is 10 atomic percent carbon and 50 to 60 atomic percent oxygen.

7. The article of claim 4 wherein the first layer is thicker than the second layer.

* * * * *